(12) United States Patent
Jansen et al.

(10) Patent No.: US 7,525,640 B2
(45) Date of Patent: Apr. 28, 2009

(54) LITHOGRAPHIC APPARATUS AND DEVICE MANUFACTURING METHOD

(75) Inventors: Bastiaan Stephanus Hendricus Jansen, Waalre (NL); Erik Roelof Loopstra, Heeze (NL); Marius Ravensbergen, Bergeijk (NL); Markus Josef Hauf, Ichenhausen (DE)

(73) Assignees: ASML Netherlands B.V., Veldhoven (NL); Carl Zeiss SMT AG, Oberkochen (DE)

( * ) Notice: Subject to any disclaimer, the term of this patent is extended or adjusted under 35 U.S.C. 154(b) by 184 days.

(21) Appl. No.: 11/593,648

(22) Filed: Nov. 7, 2006

(65) Prior Publication Data

US 2008/0123066 A1    May 29, 2008

(51) Int. Cl.
*G03B 27/54* (2006.01)
(52) U.S. Cl. ............................. 355/67; 355/71; 378/34
(58) Field of Classification Search .................. 355/67, 355/71, 30, 53; 378/34, 35; 250/492.2
See application file for complete search history.

(56) References Cited

U.S. PATENT DOCUMENTS

| 4,730,900 | A | | 3/1988 | Uehara et al. |
| 4,790,654 | A | * | 12/1988 | Clarke .................. 356/310 |
| 5,390,228 | A | | 2/1995 | Niibe et al. |
| 2006/0256307 | A1 | * | 11/2006 | Fries ..................... 355/53 |

FOREIGN PATENT DOCUMENTS

| EP | 0 678 768 A2 | 10/1995 |
| EP | 1 103 857 A2 | 5/2001 |
| WO | 2006/053751 A2 | 5/2006 |

* cited by examiner

*Primary Examiner*—D. Rutledge
(74) *Attorney, Agent, or Firm*—Pillsbury Winthrop Shaw Pittman LLP (57) ABSTRACT

A lithographic apparatus is disclosed that includes an optical arrangement having an array of optical elements arranged in a plane perpendicular to the radiation beam. Each optical element comprises an electrical heating device to change an optical path length of the radiation beam. By selectively actuating the electrical heating devices, a position dependent change in optical path length can be achieved in order to correct for irradiation-induced optical path length errors.

23 Claims, 11 Drawing Sheets

LITHOGRAPHIC APPARATUS AND DEVICE MANUFACTURING METHOD

FIELD

The present invention relates to a lithographic apparatus and a method for manufacturing a device.

BACKGROUND

A lithographic apparatus applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In IC fabrication, the continuing improvements in microprocessor speed, memory packing density and low power consumption for micro-electronic components require a continuing decrease of size of the patterns that are transferred from the patterning device to the substrate by the lithographic apparatus. As the size of an integrated circuit is reduced and its density increases, however, the CD (critical dimension) of its corresponding patterning device pattern approaches the resolution limit of the lithographic apparatus. The resolution for a lithographic apparatus is defined as the minimum feature that the apparatus can repeatedly expose on the substrate. Various techniques, known as resolution enhancement techniques, have been applied in order to extend the resolution limit of the lithographic apparatus.

One technique to improve resolution is off-axis illumination. With this technique, the patterning device is illuminated at a selected non-perpendicular angle which may improve resolution, and particularly improves the process latitude by increasing the depth of focus and/or contrast. The angular distribution at the patterning device plane, which is an object plane, corresponds to a spatial distribution in a pupil plane of the optical arrangement of the lithographic apparatus. Typically, the shape of the spatial distribution in a pupil plane is referred to as an illumination mode. One known illumination mode is annular, in which the conventional zero order spot on the optical axis is changed to a ring-shaped intensity distribution. Another mode is multipole illumination in which several spots or beams are produced which are not on the optical axis. Examples of multipole illumination modes are dipole, comprising two poles and quadrupole, comprising four poles. For illumination modes such as dipole and quadrupole, the size of the poles in the pupil plane can be very small compared to the total surface of the pupil plane. Consequently, all of the radiation used for exposing the substrate traverses the various optical elements at or near the pupil planes at the locations of these poles only. A fraction of the radiation traversing the one or more optical elements (e.g., one or more lenses) is absorbed by the element(s). This leads to a non-uniform heating of the element(s) by the radiation beam, resulting in a local change in refractive index and a deformation of the element(s). The local change in refractive index and deformation of the element(s) results in a distorted aerial image as projected by the projection system onto the resist layer.

SUMMARY

According to an aspect of the invention, there is provided a lithographic apparatus, comprising:
  an illumination system configured to condition a radiation beam according to an intensity distribution;
  a support constructed to hold a patterning device, the patterning device configured to impart the conditioned radiation beam with a pattern in its cross-section to form a patterned radiation beam;
  a substrate table constructed to hold a substrate;
  a projection system configured to project the patterned radiation beam onto a target portion of the substrate; an array of optical elements arranged transverse to and in a path of the radiation beam, wherein each optical element comprises an individually addressable electrical heating device configured to locally heat the optical element; and
  a control unit configured to control the heating devices depending on a phase map of the patterned radiation beam at a pupil plane of the projection system.
  In an embodiment, the phase map is derived from the intensity distribution. The lithographic apparatus may be provided with an interferometer configured to measure the phase map.

In an embodiment, the control unit is arranged to further control the heating devices depending on a history of previously applied intensity distributions and/or a history of applied actuation of the heating devices.

In an embodiment, the optical element is provided with a channel configured to transport a fluid from a supply container to the optical element so as to establish a static temperature distribution across the optical element. The control unit may be arranged to further control the heating devices depending on a transport velocity and temperature of the fluid.

In an embodiment, the channel is provided with at least two substantially parallel plates. The heating device may be located on a surface, facing the fluid, of at least one of the plates. In an embodiment, the heating device is located on a surface, opposite of the fluid, of at least one of the plates.

In an embodiment, the optical element is provided with a further channel sharing one of the plates of the channel. The heating device may be located on the surface of the shared plate.

In an embodiment, the optical elements are comprised in a single structure.

In an embodiment, each heating device comprises an elongated conductor. The elongated conductor may comprise one of the group of Cr, Cu, Au and Al. The cross-section of the elongated conductor may conform to a trapezium-shape.

In an embodiment, the fluid comprises a gas. The gas may substantially comprise nitrogen. In an embodiment, the fluid comprises a liquid.

According to an aspect of the invention, there is provided a device manufacturing method comprising:
  imparting a radiation beam with a pattern in its cross-section to form a patterned radiation beam;

projecting the patterned radiation beam onto a target portion of a substrate using a projection system;

locally changing an optical path length of the radiation beam using an array of optical elements arranged transverse to the radiation beam, each optical element comprising an individually addressable electrical heating device; and controlling the heating devices depending on a phase map in a pupil plane of the projection system.

In an embodiment, the method further comprises deriving the phase map from an intensity distribution of the radiation beam.

In an embodiment, the method further comprises controlling the heating devices depending on a history of previously applied intensity distributions and/or a history of applied actuation of the heating devices.

In an embodiment, the method further comprises transporting a fluid through a channel in the optical element to establish a static temperature distribution across the element. In an embodiment, the method further comprises controlling the heating devices depending on a transport velocity and temperature of the fluid.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
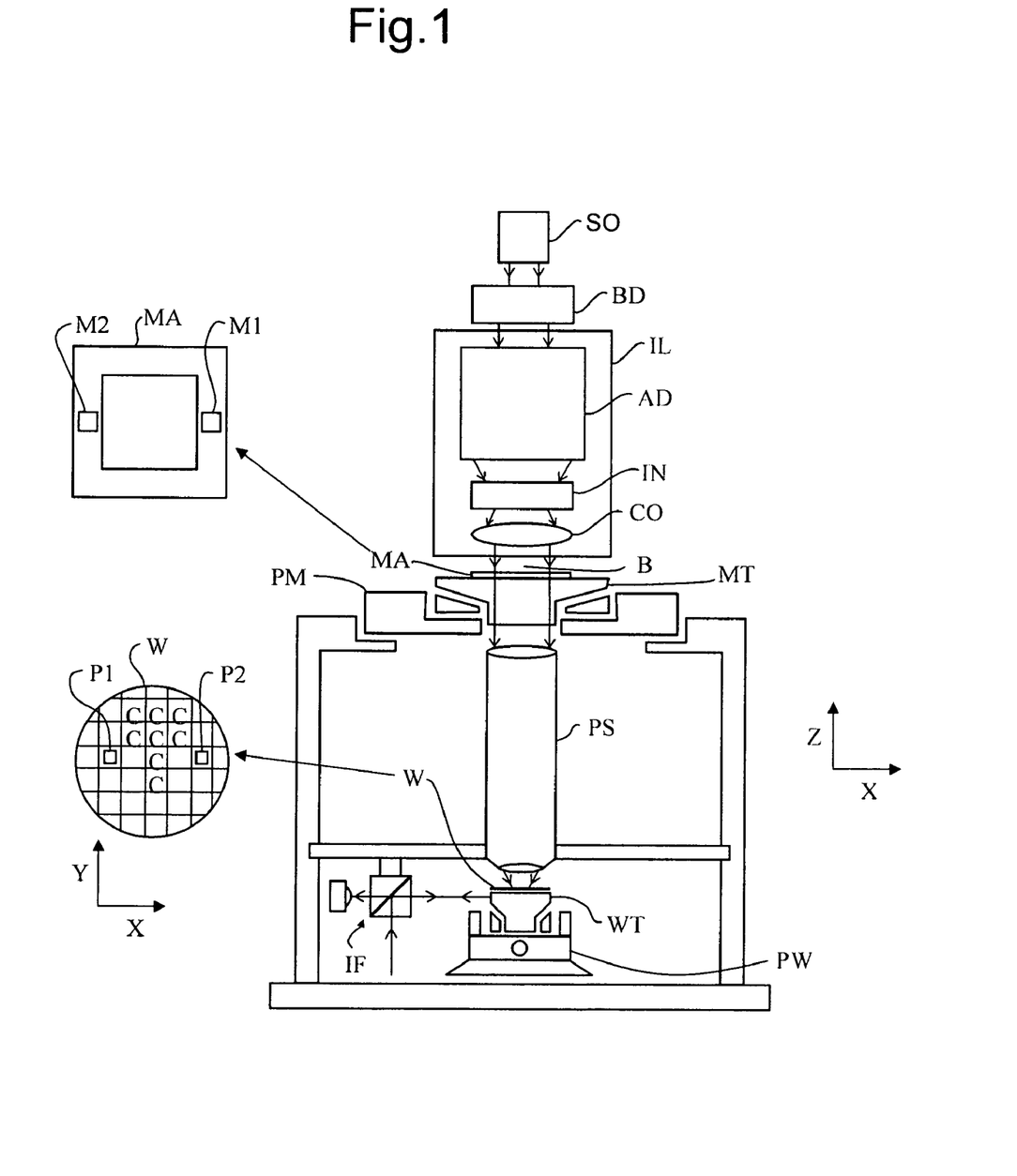
FIG. 1 shows a lithographic apparatus according to an embodiment of the invention.

FIG. 1 schematically shows a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
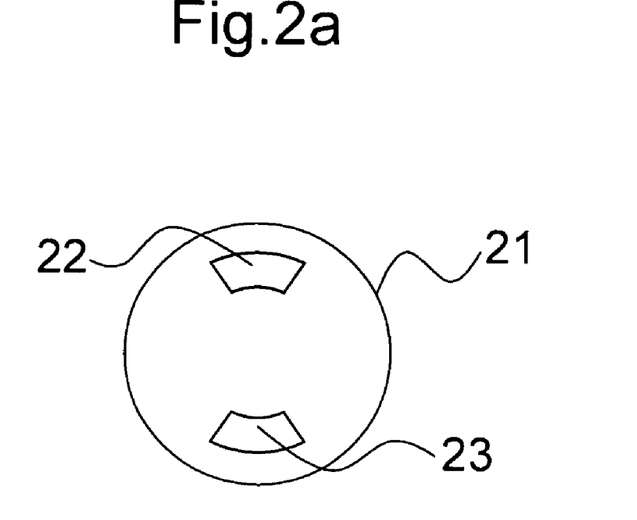
FIG. 2a shows a dipole intensity distribution of a radiation beam in a pupil plane.
Figure 2B:
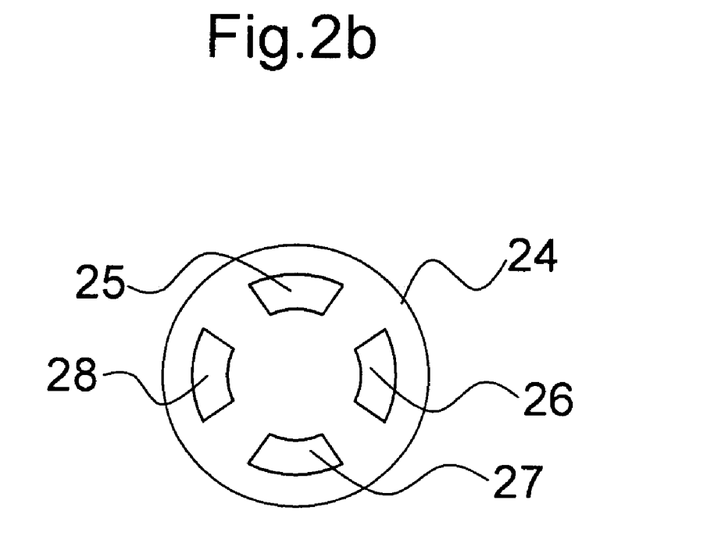
FIG. 2b shows a quadrupole intensity distribution of a radiation beam in a pupil plane.

FIG. 2a shows an example of an intensity distribution of the radiation beam in a pupil plane 21 in the illuminator or projection system. The intensity distribution of the radiation beam comprises two poles 22 and 23, defining the portion of the cross-section of the pupil plane through which substantially all radiation of the radiation beam traverses the pupil plane. FIG. 2b shows a second example of an intensity distribution in a pupil plane 24, comprising four poles 25, 26, 27 and 28. In the following description, the intensity distribution of the radiation beam in a pupil plane is referred to as an illumination mode. The intensity distribution shown in FIG. 2a is a dipole illumination mode. The intensity distribution shown in FIG. 2b is a quadrupole illumination mode.

As the radiation beam traverses a refractive optical element (e.g., a lens), a small portion of the radiation beam is absorbed by the element. The absorption of the radiation beam by the element causes the element to heat up. Heating of the element results in a change in refractive index of the element at the location of absorption and a deformation of the element. For an element positioned at a location where the radiation beam traverses the element uniformly, this absorption results in a uniform heating of the element and a uniform change in refractive index. For an element positioned at or near a pupil plane, the portion of the cross-section of the element through which the radiation beam traverses the element is dependent on the applied illumination mode. For an illumination mode such as dipole or quadrupole, the element absorbs radiation non-uniformly across the surface of the element, causing a non-uniform change in refractive index and deformation of the element. The local changes in refractive index and deformation of one or more elements in the projection system result in a change in optical path length of different portions of the radiation beam traversing the elements. The changes in optical path length differences causes the portions of the radiation beam to recombine into an aerial image at substrate level that is distorted with respect to the object image at patterning device level due to an optical path length difference between the recombining portions of the radiation beam. An example of an imaging parameter that is negatively affected by this difference is the field position dependent focus offset.

Figure 3:
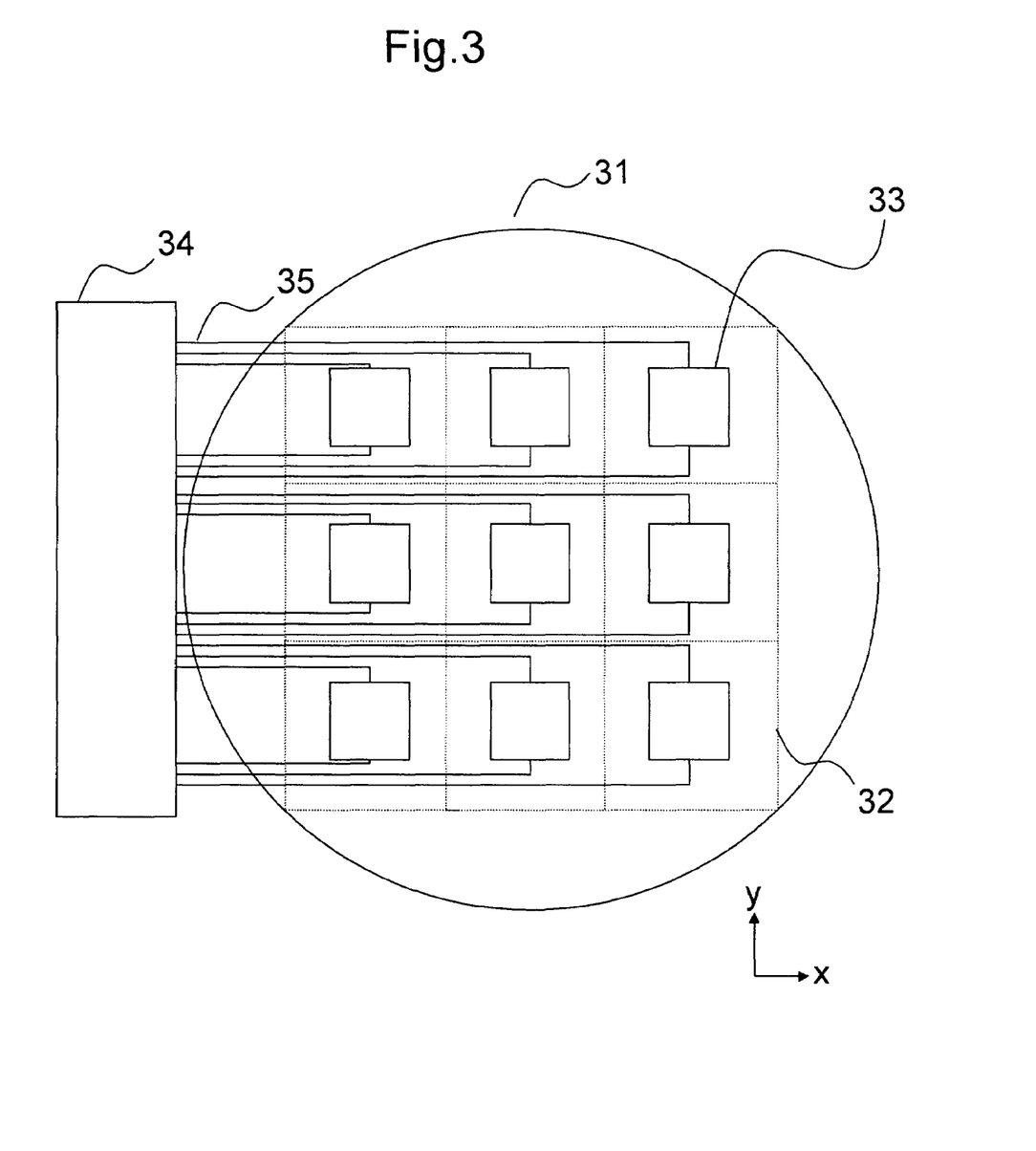
FIG. 3 shows an optical arrangement comprising an array of optical elements.

FIG. 3 shows an optical arrangement 31 according to an embodiment of the invention. The optical arrangement 31 comprises an array of nine optical elements 32. This number of optical elements is chosen for illustration purpose only. In practice, the number of optical elements may be substantially larger, for example 128 or 256 optical elements. The optical arrangement is positioned in the radiation beam such that the array of optical elements is arranged substantially perpendicularly to the radiation beam. The optical elements 32 are arranged to transmit sub beams of the radiation beam. Each optical element comprises an individually addressable electrical heating device 33 configured to locally heat the optical element 32. The individually addressable electrical heating devices 33 are electrically connected to a control unit 34 via conductors 35. Heating of one or more of the optical elements 32 changes the refractive index of those one or more optical elements 32. In operation, the control unit 34 adjusts the heat dissipation of each electrical heating device such that the optical path lengths of the sub beams transmitted via the associated optical elements 32 are mutually equal. With the adjusted optical path lengths of the various sub beams of the radiation beam, an aerial image is created that more accurately resembles the object image. The optical arrangement 31 may be positioned at or near a pupil plane of the illuminator or projection system. Positioning the optical arrangement at or near a pupil plane provides a spatial correlation between a desired change in optical path length at a specific position in the pupil plane and the heating device at that specific position in the pupil plane. Furthermore, by positioning the optical arrangement at or near a pupil plane, the electrical heating devices will not be imaged by the illumination system and the projection system onto the substrate.

The optical elements 32 may comprise $Al_2O_3$, $CaF_2$ or $SiO_2$. Such materials have a known refractive index, dependency of the refractive index on temperature, thermal conductivity, coefficient of thermal expansion and specific heat capacity. The optical elements 32 may be comprised in an integrated structure. An example of such an integrated structure is a $SiO_2$ plate that is arranged in a plane perpendicular to the radiation beam. With the $SiO_2$ plate having an optical power of 1 and placed at or near a pupil plane, the optical characteristics of an optical system in which the $SiO_2$ plate is positioned, is changed to a limited, acceptable extent. An exchange mechanism may be provided to inserting and remove the $SiO_2$ plate into and out of the radiation beam path. Alternatively, the integrated structure may replace an existing element in the optical system and have optical characteristics corresponding to the element it replaces.

The optical path length variation as a function of position in the pupil plane can be described by a surface profile and is referred to as a phase map. The desired adjustment of the optical path lengths of the different portions of the radiation beam can be obtained by measuring the phase map of a radiation beam in a pupil plane of the optical arrangement using a known interferometer arrangement. An advantage of determining the change in optical path length directly by measuring a phase map in a pupil plane is that an accurate correction can be applied, also when the change in optical path length caused by heating of the various elements has not stabilized yet. The measurements can be performed when the lithographic apparatus is not operated continuously or when the lithographic apparatus is operated subsequently at settings with different illumination modes, resulting in a continuously changing phase map. Conventional lithographic tools may be equipped with a known sensor that includes an interferometric wavefront measurement system arranged at or near a substrate table to measure in-situ the wave front of the radiation beam. In this embodiment, the control unit 34 is configured to address the heating devices 33 in dependence on the measured phase map. In operation, the phase map is measured using the interferometer arrangement. The phase map provides phase changes of different sub beams of the radiation beam that traverse the optical arrangement, the phase changes being used to correct the irradiation induced optical path length differences. A desired change in refractive index for each optical element 32 in the optical arrangement 31 is determined from the corresponding phase change of the phase map. Subsequently, the amount of heat is determined that needs to be dissipated into each optical element of the plurality of optical elements to create the desired change in refractive index. Subsequently, each electrical heating device 33 is individually addressed by the control unit 34 to dissipate the determined amount of heat into each optical element 32 associated with the electrical heating device by controlling the current and addressing period. Of course, the current and/or addressing period of each electrical heating device may be determined by other methods from the measurement of phase changes from the phase map.

The phase map may be determined once for each employed illumination mode. Alternatively or additionally, the phase map may be determined periodically. Depending on the extent of change over time of the measured phase map, the phase map may be determined each time after a different illumination mode is selected. Alternatively or additionally, the phase map may be measured at other intervals, such as after exposing a certain number of substrates or after certain time intervals.

The control unit 34 may further take into account a history of applied illumination modes to address the heating devices.

Changing illumination modes may result in a different non-uniform heating of one or more of elements in the illumination system and/or projection system. After continued use of the new illumination mode, the change in refractive index and the deformation of the element(s) will stabilize. However, initially after changing the illumination mode there will be a specific time duration in which the phase map is changing continuously. The length of this time duration will depend on the heat capacity of the element(s). Although this continuous change in phase map can be addressed by frequent measurement of the phase map, the frequent measurements reduce the amount of time in which the lithographic apparatus may be used for normal operation. Instead, a determination of the heat capacity of the element(s) may be performed allowing a feedforward correction of the phase map without requiring measuring the phase map.

Furthermore, the control unit 34 may take into account a pattern of the patterning device MA that is used for exposure, to address the electrical heating devices 33. In this case, separate ray-tracing calculations may be used for each used combination of illumination mode, radiation beam intensity and pattern of the patterning device MA.

Alternatively or additionally, the phase map may be derived from the applied illumination mode. The phase map may determined using conventional ray-tracing software. In this embodiment, the control unit 34 is configured to address the heating devices 33 to generate an amount of heat in the associated optical element 32 based on the determined phase map. Since the optical and thermal characteristics of the optical elements 32 are known, the amount of heat needed to achieve a desired change in optical path length in the optical elements 32 can be determined.

For each applied illumination mode and a corresponding, constant radiation beam intensity, the change in optical path lengths should be determined. The actual change in optical path lengths will further depend on the usage history of the lithography apparatus, such as the number of exposures per substrate and the number of substrates that are exposed. Therefore, only an estimation of the required correction may be determined. Furthermore, at the start of the exposures the element(s) of the illumination system and/or projection system will be at a lower temperature and thus the optical path lengths will initially not be stable and change throughout the exposures until reaching a relatively stable profile.

Figure 4:
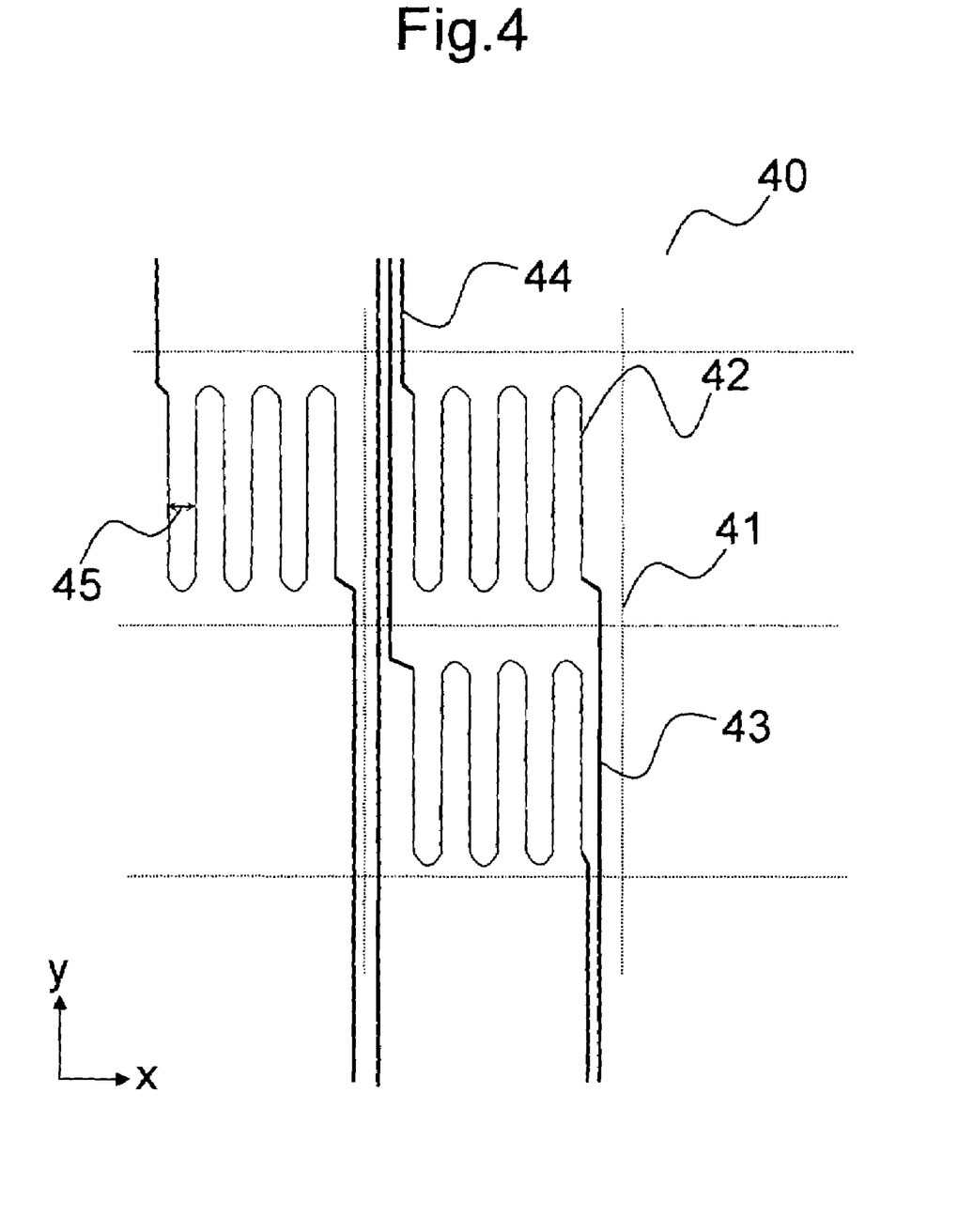
FIG. 4 shows an optical arrangement comprising a plurality of electrical heating devices arranged in a first configuration.

FIG. 4 shows an embodiment of a configuration of three electrical heating devices on the optical arrangement 40. This number of optical elements is chosen for illustration purpose only. In practice, the number of optical elements may be substantially larger, for example 128 or 256 optical elements. Each optical element of the array of optical elements 41 is provided with an electrical heating device comprising a meandered conductor 42 to dissipate heat to the associated optical element 41. The meandered conductors 42 may have a width of 200 nm. Alternatively, the meandered conductor 42 may have an elongated shape other than a meandered shape. The electrical heating devices further comprise conductors 43, 44 to connect the meandered conductor 42 to a control unit not shown in FIG. 4. The meandered conductor 42 may substantially comprise Cr, Cu, Au or Al. The conductors 42, 43, 44 may be provided on the optical arrangement through conventional e-beam writing techniques or vapor phase deposition techniques.

Figure 5:
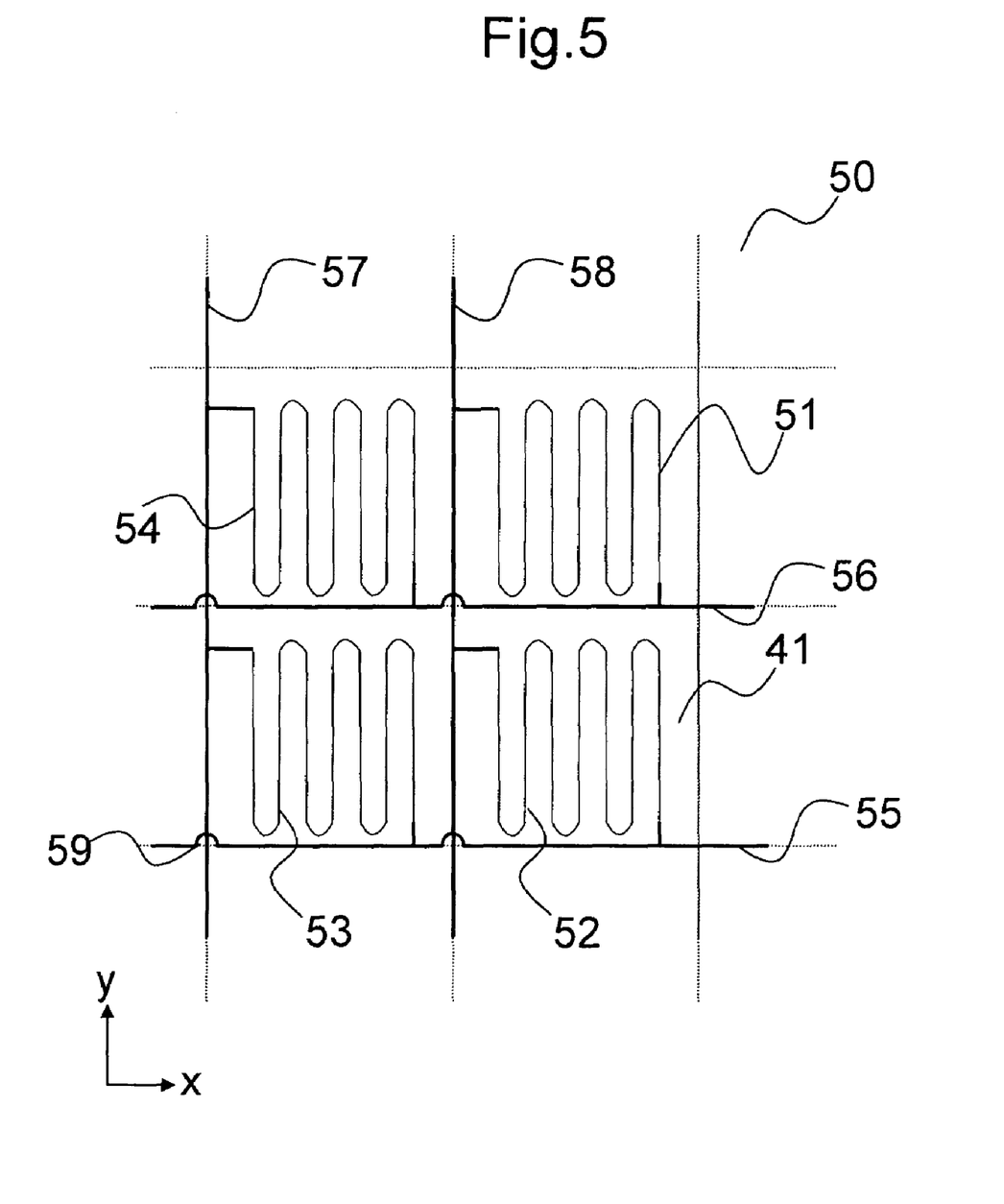
FIG. 5 shows an optical arrangement comprising a plurality of electrical heating devices arranged in a second configuration.

FIG. 5 shows an embodiment of an optical arrangement 50 comprising four electrical heating devices 51, 52, 53 and 54. In this embodiment, the conductors 55, 56, 57, 58 extend as straight lines across the entire optical arrangement 50 and are arranged periodically in two mutually perpendicular directions. The conductors 55, 56, 57, 58 electrically connect the meandered conductors 51, 52, 53, 54 to a control unit not shown in FIG. 5 and are separated from each other via bridges 59. The control unit addresses each consecutive electrical heating device of the four electrical heating devices using a known time multiplexing addressing technique to generating a desired amount of heat in the associated optical elements.

Figure 6A:
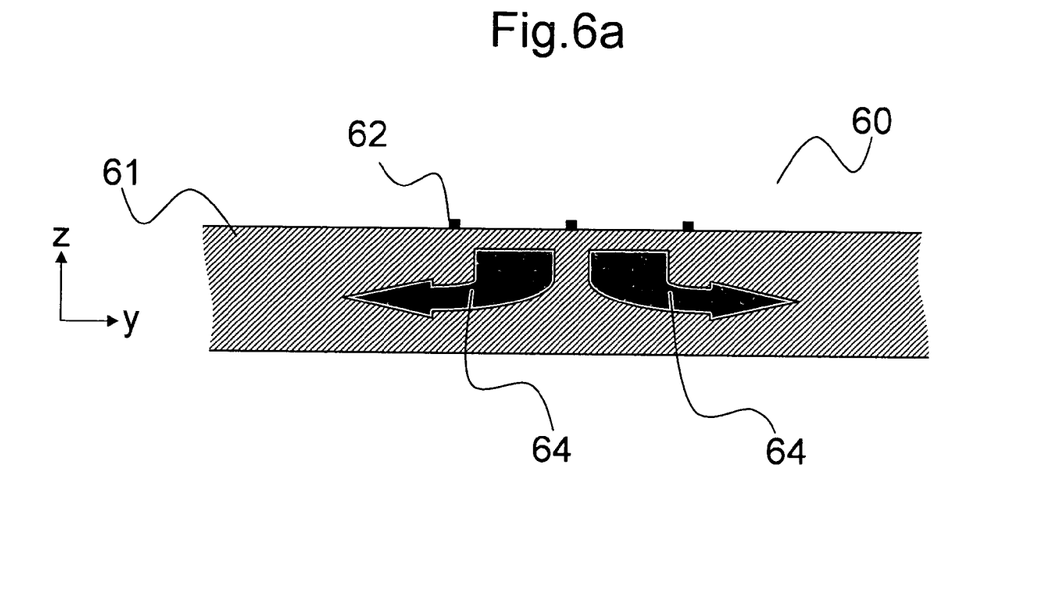
FIG. 6a shows an optical arrangement with a plurality of electrical heating elements and a heat flow within the optical element.

FIG. 6a shows a cross-sectional view of an embodiment of the optical arrangement. In this optical arrangement 60, the optical elements are comprised in one refractive optical member 61. The optical member comprises the multiple electrical heating devices, of which three devices 62 are shown. The optical member 60 may be supported at edges of the member and may be placed in a conditioned environment within a plurality of optical elements forming the projection system and/or illuminator. The conditioned environment may comprise, for example, filtered ambient air that is temperature controlled. In operation, the electrical heating elements 62 generate heat and due to the lower transfer of heat to the surrounding air than to the surrounding optical material, substantially all of the generated heat is transferred into the optical member. Heat will flow from the optical member material having a higher temperature near the heating devices 62 to the surrounding optical material as indicated by arrows 64. Due to the conduction of heat within the optical member in a direction perpendicular to the radiation beam, i.e. in X-direction and Y-direction, the gradient of the phases at each point of the static phase map that can be achieved is reduced.

Figure 6B:
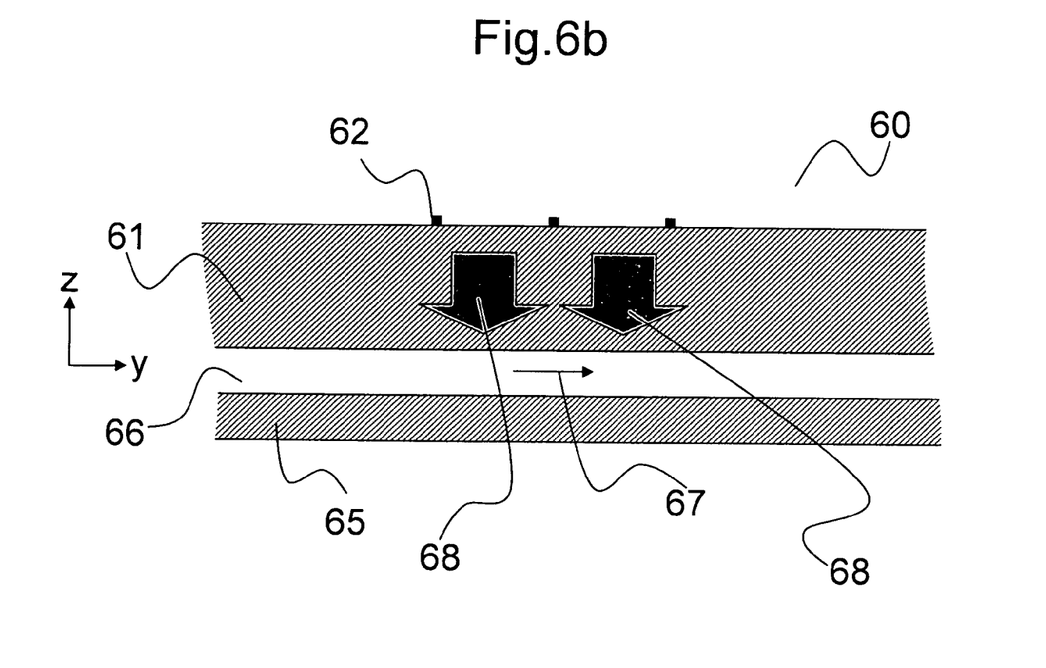
FIG. 6b shows an optical arrangement comprising a channel, a plurality of electrical heating elements and a heat flow within the optical element.

FIG. 6b shows an embodiment of an optical member 60 wherein the transfer of heat within the optical member 60 in a direction perpendicular to the radiation beam is reduced. For this purpose, a channel 66 confined by optical member sections 61 and 65 is arranged to create a heat transfer within the optical member substantially in a direction parallel to the radiation beam as indicated by arrows 68. This is achieved by guiding a fluid, for example a gas such as filtered ambient air or any other non-reactive gas, such as a gas comprising substantially $N_2$, from a supply container through the channel 66 as indicated by arrow 67, wherein the gas is kept at a lower temperature than the optical member. Typically, the channel will have dimensions in X and Y directions comparable to the size of the member and a height in Z-direction of less than 10 mm. The temperature of the gas may be kept constant using a known temperature control device arranged in between the supply container and the optical arrangement. The gas may be reused by enabling a circulation loop wherein the gas after passing the member is transported back to the supply container. Alternatively, the fluid may be a liquid, such as water.

Figure 7:
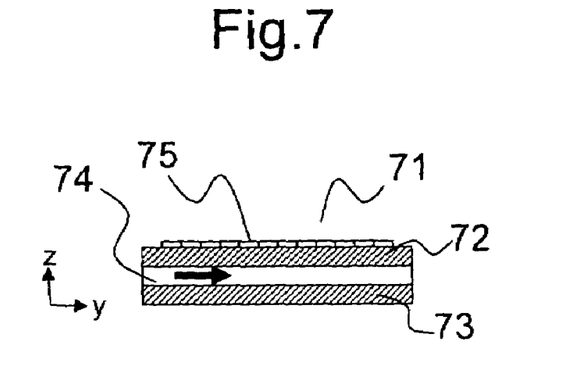
FIG. 7 shows an optical arrangement comprising one channel and an array of electrical heating devices.

FIG. 7 shows a cross section along the X-axis of an embodiment of an optical member 71. The optical member 71 comprises two plane, substantially parallel plates 72, 73, enclosing a channel 74. The optical member further comprises an array of electrical heating devices 75. The direction of the radiation beam is substantially parallel to the Z-axis and the direction of transport of the fluid is substantially parallel to the Y-axis, as indicated by the arrow. Alternatively or additionally, an array of electrical heating devices may be arranged on a side of the plate 73 facing away from the channel 74.

In an embodiment, the surface of the optical arrangement that is covered by the conductors is less than 1%. This optical arrangement comprises an optical member having an effective diameter of 76 mm, the optical member comprising 256 heating devices arranged in an array with unit cells size of 5×5 mm, wherein the heating devices comprise meandered conductors configured to dissipate heat having a width of 200 nm and a length of 60 mm. The meandered conductors are connected to the control unit via conductors, wherein the conductors have a width of 10 μm and a length of 80 mm. The electrical heating devices manufactured in Cr have a thickness of 100 nm, which is the normal thickness for conventional Cr patterns as manufactured onto reticles using known e-beam writing techniques. For an optical arrangement comprising two $SiO_2$ plates each having a thickness of 5 mm, the optical elements have a dimension of 5×5×5 mm. FIG. 7 shows this embodiment wherein the optical elements are integrated in one structure, being the plate 72. With a peak phase correction equivalent to an optical path length difference of 70 nm, the maximum required temperature increase of an optical element is 1.4° K at the surface where the heating devices are arranged and an average temperature increase of 0.7° K across the optical element. This temperature distribution across the optical element may be achieved by applying an electrical heating device as mentioned above having a maximum power output of 10 mW arranged on the first side of the optical element and arranging a cooling mechanism at the second side of the optical element by thermal interaction between the optical element and the fluid flowing though the channel 74. For achieving the temperature distribution across the optical element as described above, the channel is to be configured having a height in the Z-direction of 1.7 mm, wherein the fluid is water flowing at a rate of 0.65 l/min and having a temperature of 22° C.

Figure 8:
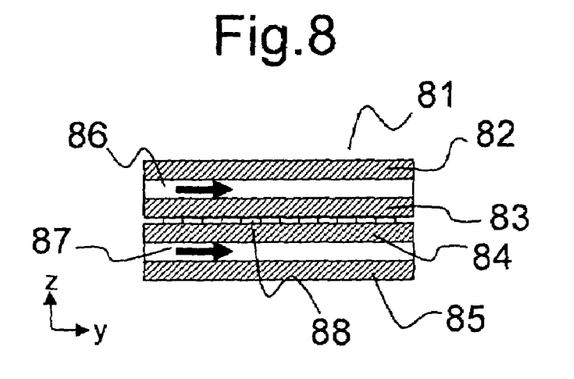
FIG. 8 shows an optical arrangement comprising two channels and an array of electrical heating devices.

FIG. 8 shows a cross section along the X-axis of an embodiment of an optical member 81. The optical member 81 comprises four plane, substantially parallel plates 82, 83, 84 and 85. In this embodiment, the optical member comprises two channels, wherein the first channel 86 is enclosed by plates 82 and 83 and the second channel 87 is enclosed by plates 84 and 85. An array of electrical heating devices 88 is arranged in between plates 83 and 84. The electrical heating devices may be attached to plate 83, 84 or both 83 and 84. An advantage of this embodiment is that the transfer of heat generated within the optical member 81 to the fluid surrounding the optical member is minimized, ensuring a minimal thermal disturbance of the optical system.

Figure 9:
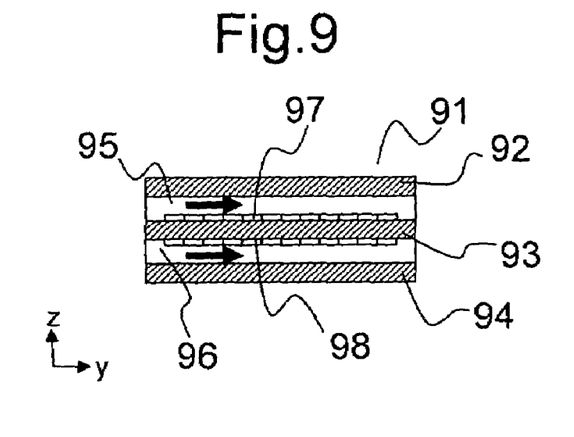
FIG. 9 shows an optical arrangement comprising two channels and an array of electrical heating devices.

FIG. 9 shows a cross section along the X-axis of an embodiment of an optical member 91. The optical member 91 comprises three plane, substantially parallel plates 92, 93 and 94. Furthermore, the optical member comprises two channels, wherein the first channel 95 is enclosed by the first plate 92 and the middle plate 93 and the second channel 96 is enclosed by the middle plate 93 and the third plate 94. The optical member 91 comprises two arrays of electrical heating devices, wherein the first array of electrical heating devices 97 is arranged on a first side of the middle plate 93 opposite the first plate 92 and the second array of electrical heating devices 98 is arranged on a second side of the middle plate 93 opposite to the third plate 94. In this embodiment, the transfer of heat generated within the optical member 91 to the environment surrounding the optical member may be minimized, for a minimal thermal disturbance of the optical system. A further advantage of this embodiment is the reduced height of the optical member with respect to embodiment of FIG. 8. Alternatively, only one array of electrical heating devices 97 may be arranged at one side of the middle plate 93 opposite one of the first and third plate 92, 94.

Figure 10:
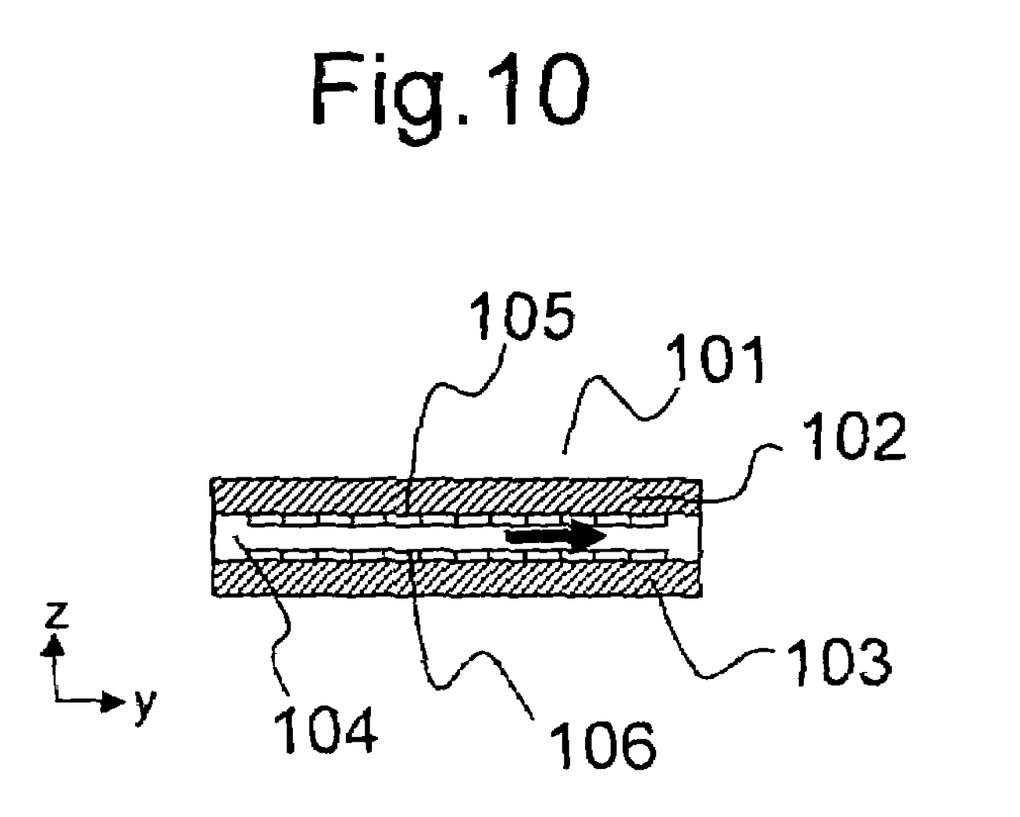
FIG. 10 shows an optical arrangement comprising one channel and two arrays of electrical heating elements.

FIG. 10 shows a cross section along the X-axis of an embodiment of an optical member 101. The optical member 101 comprises two plane, substantially parallel plates 102 and 103, enclosing a channel 104. Furthermore, the optical member comprises two arrays of electrical heating devices, wherein the first array 105 is arranged on a first side of the first plate 102 opposite the second plate 103 and the second array 106 is arranged on a first side of the second plate 103 opposite the first plate 102. Advantages of this embodiment may include the limited height and the double arrays of electrical heating devices, allowing a large phase offset to be realized due to the heating of two plates 102, 103. With the electrical heating devices 105, 106 being arranged inside the optical member 101 only, the amount of heat transferred to the environment surrounding the optical member 101 is limited. Alternatively, only one array of electrical heating devices may be arranged at the first side of the first plate 102 opposite the second plate 103 or on at the first side of the second plate 103 opposite the first plate 102.

Figure 11A:
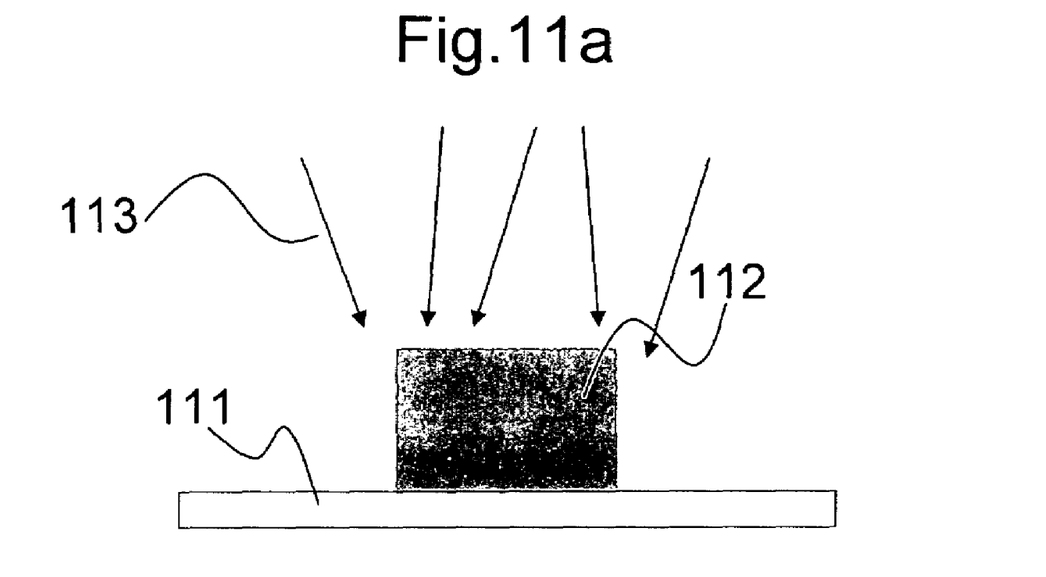
FIG. 11a shows a cross-section of a square-shaped heating device.
Figure 11B:
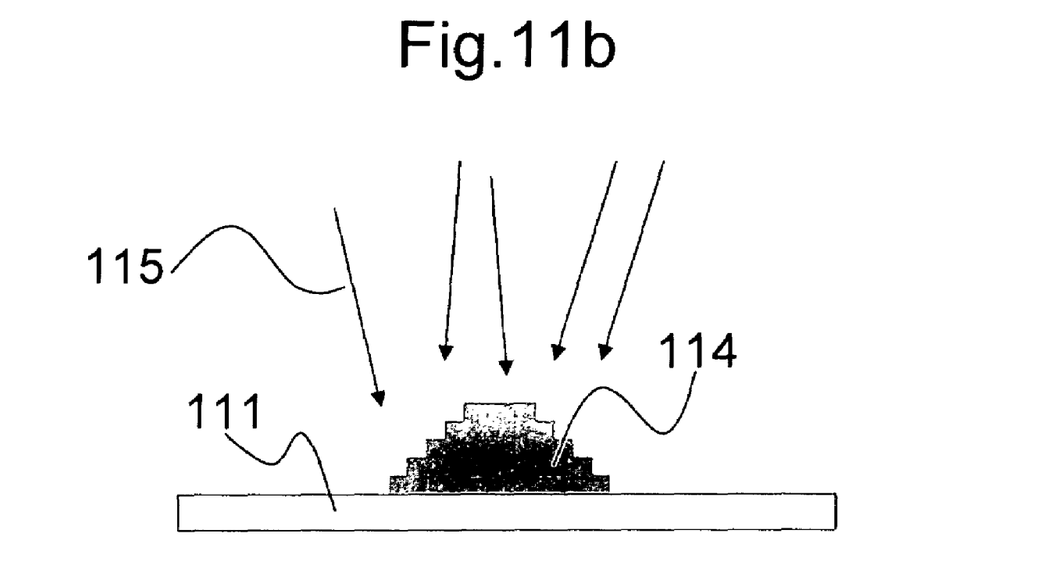
FIG. 11b shows a cross-section of a trapezium-shaped heating device.

FIG. 11a shows a cross-section of a connecting conductor 112 to a heating device arranged on an optical member 111. The resistance of the connecting conductors needs to be lower than the resistance of the meandered conductors by a factor of approximately 10 or 100 such that the amount of heat dissipated in the connecting conductors is minimized. This low resistance requires connecting conductors with a larger cross-section than the cross-section of the meandered conductors. However, the width of the connecting conductors should be kept limited such that the amount of radiation that is blocked by those conductors is limited. FIG. 11b shows a cross-section of an embodiment of a connecting conductor 114 of a heating device. In this embodiment, the conductor is trapezium-shaped, wherein the width of the conductor reduces with increasing height. The advantage of this embodiment is that the blocking of radiation 115 by the conductor 114 is independent of the angles at which the radiation traverses the optical element 111. A conductor according to this embodiment may be manufactured in a sequence of multiple e-beam writing steps or a sequence of multiple steps of a vapor phase deposition technique, wherein each consecutive step corresponds to a specific width of the conductor layer, which width is incrementally decreased with a predetermined amount.

For a conventional lithographic apparatus, local changes in optical path length as a result of local heating of an element due to an illumination mode such as dipole or quadrupole, may be as large as 200 nm. The phase map as referred to above can be described in Zernike polynomial functions. Zernike polynomials are a set of orthogonal polynomials that arise in the expansion of a wave front function for optical systems with circular pupils. The heating power of the control unit and electrical heating devices may be dimensioned to correct for the entire phase map. In this arrangement, the maximum power requirement of the electrical heating devices results in electrical heating devices of substantial dimensions, having a large width and height. Alternatively, the maximum obtainable heating power of the heating devices may be designed to be lower than the required power to correct the lower order and higher order Zernike polynomial functions of the phase map. Typically, the largest amplitudes in the phase map are part of the lower order Zernike polynomial functions. Correction of such lower order components of the phase map may also be achieved by conventional lens manipulators that are available in lithographic apparatus. For the higher order components of the phase map that are described by the sixth order Zernike polynomial and up, no conventional lens manipulators are available. In a lithographic apparatus as referred to above, amplitudes of these frequency components of the phase map may be as large as 70 nm. An advantage of designing the heating devices such that only these higher order components can be corrected for is that the heating devices can be reduced in size and therefore block less radiation traversing the optical arrangement.

Figure 12A:
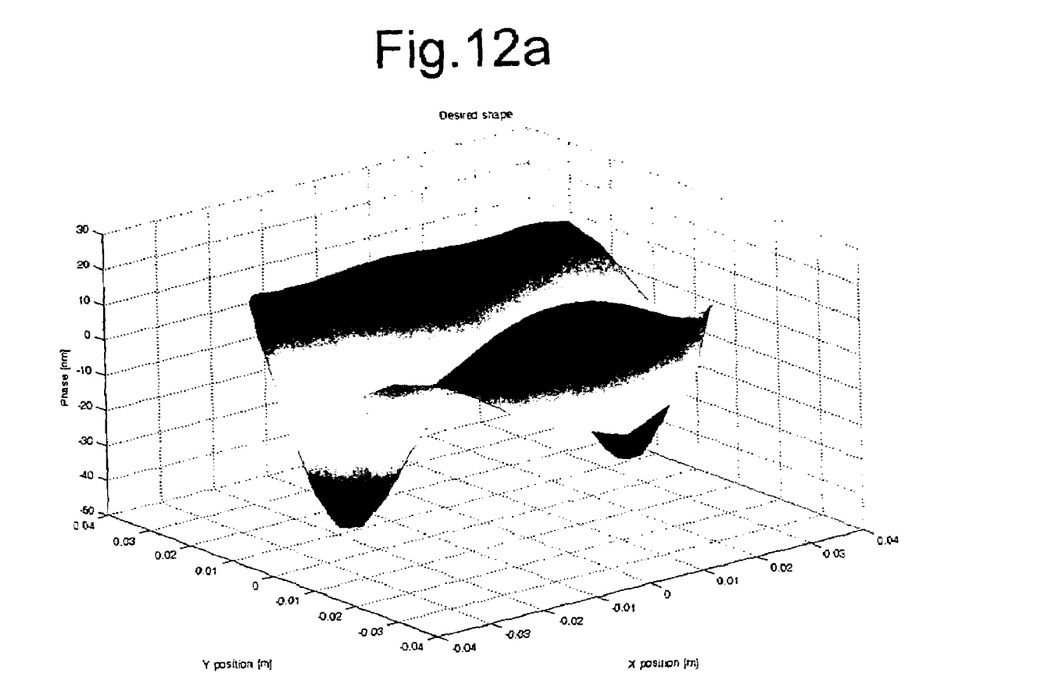
FIG. 12a shows a 3D plot of a desired phase correction across a pupil plane of the lithographic apparatus.

FIG. 12a shows an example of a 3D representation of a phase map used to correct an irradiation-induced spatial optical path length error caused in a projection system of a lithographic apparatus. The applied illumination mode is dipole illumination, which is shown by the two negative peaks on the X-axis at corresponding positions where substantially all of the radiation traverses the elements located near the pupil plane of the projection system. Accordingly, FIG. 12a shows that at these locations the largest correction in optical path length is desired. For this particular illumination mode and exposure settings, a range in optical path length differences across the pupil plane of approximately 40 nm are determined. In the 3D representation of the required phase change, an offset has been applied such that the profile is normalized to zero.

Figure 12B:
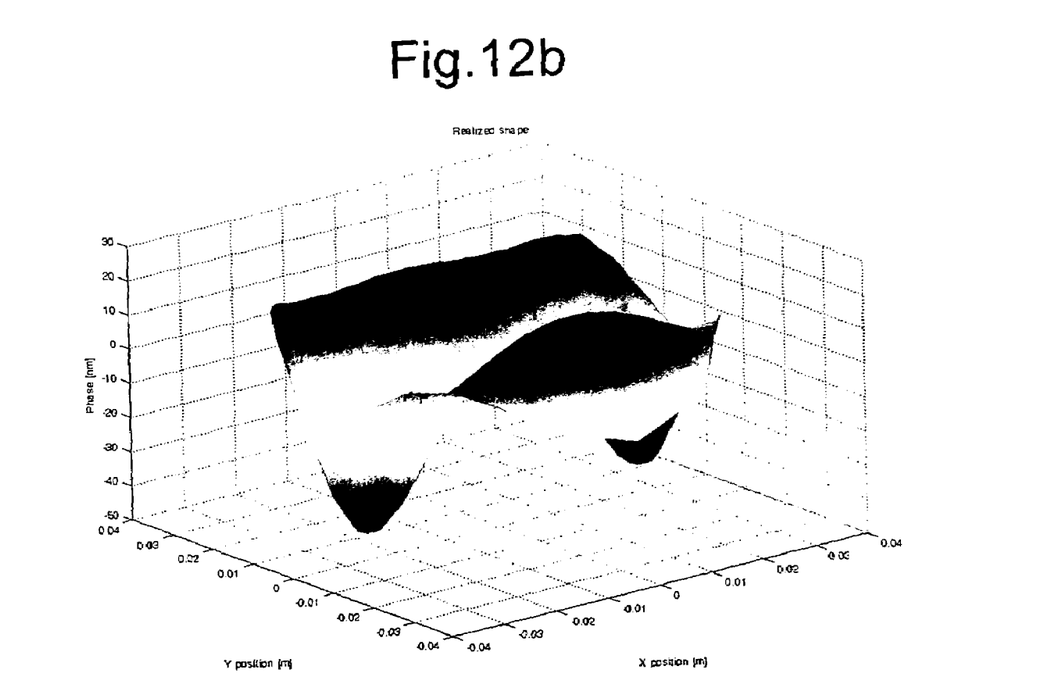
FIG. 12b shows a 3D plot of a realized phase correction across a pupil plane of the lithographic apparatus.

FIG. 12b shows a 3D representation of the phase map that may be accomplished by using a plane, substantially parallel plate optical member according to the embodiment of FIG. 6b. In this calculation, the optical member is positioned in a pupil plane of the projection system.

Figure 12C:
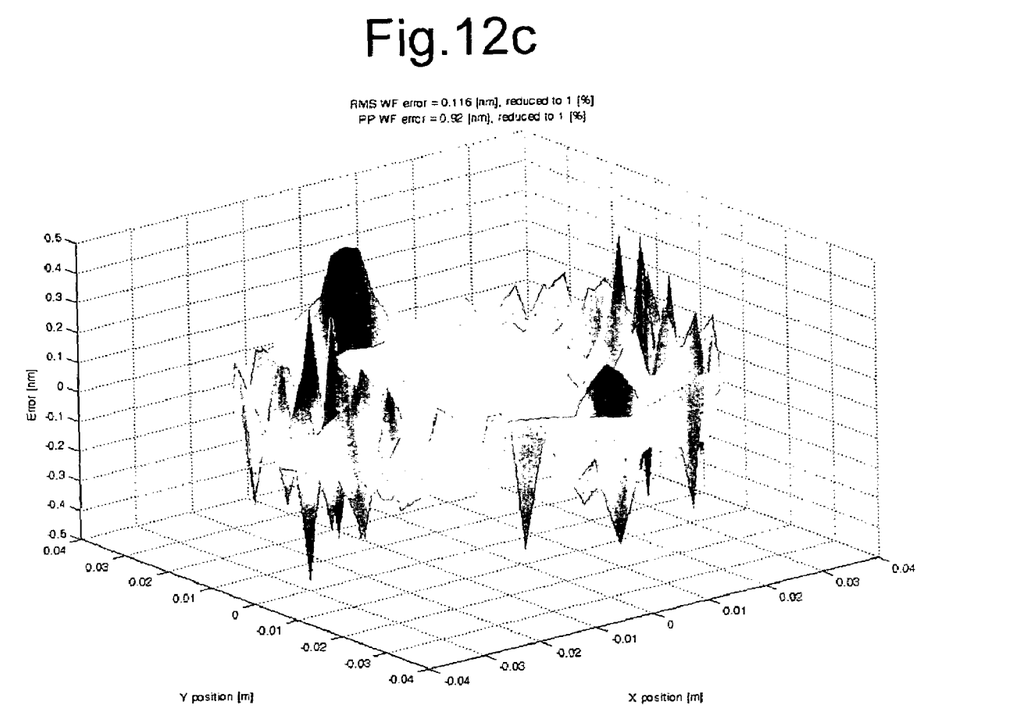
FIG. 12c shows a 3D plot of a remaining phase error after correction across a pupil plane of the lithographic apparatus.

FIG. 12c shows a 3D representation of the RMS phase error between the mathematically desired correction according to FIG. 12a and the physical correction according to FIG. 12b that can be obtained. With the embodiment of FIG. 12b, the RMS phase error is limited to less than 1 nm, resulting in an improved aerial image as projected by the projection system onto the substrate in the image plane that more accurately represents the patterning device pattern in the object plane of the projection system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm). The term "lens", where the context allows, may refer to any one or combination of various types of optical components, including refractive, reflective, magnetic, electromagnetic and electrostatic optical components.

One or more aspects of one or more embodiments herein may be used with or substituted for one or more aspects of one or more other embodiments herein. While the discussion herein has mostly focused on transmissive optical systems, one or more embodiments described herein may also apply for reflective optical systems or a combination of reflective and transmissive optical systems.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
an illumination system configured to condition a radiation beam according to an intensity distribution;
a support constructed to hold a patterning device, the patterning device configured to impart the conditioned radiation beam with a pattern in its cross-section to form a patterned radiation beam;
a substrate table constructed to hold a substrate;
a projection system configured to project the patterned radiation beam onto a target portion of the substrate;
an array of optical elements arranged transverse to and in a path of the radiation beam, wherein each optical element comprises an individually addressable electrical heating device configured to locally heat the optical element; and
a control unit configured to control the heating devices depending on a phase map of the patterned radiation beam at a pupil plane of the projection system.

2. The lithographic apparatus of claim 1, wherein the phase map is derived from the intensity distribution.

3. The lithographic apparatus of claim 1, further comprising an interferometer arranged to measure the phase map.

4. The lithographic apparatus of claim 1, wherein the control unit is arranged to further control the heating devices depending on a history of previously applied intensity distributions, or a history of applied actuation of the heating devices, or both histories.

5. The lithographic apparatus of claim 1, wherein at least one optical element of the array of optical elements comprises a channel configured to transport a fluid from a supply container to the at least one optical element so as to establish a static temperature distribution across the at least one optical element.

6. The lithographic apparatus of claim 5, wherein the control unit is arranged to further control the heating devices depending on a transport velocity and temperature of the fluid.

7. The lithographic apparatus of claim 5, wherein the channel comprises at least two substantially parallel plates.

8. The lithographic apparatus of claim 7, wherein the heating device is located on a surface, facing the fluid, of at least one of the plates.

9. The lithographic apparatus of claim 7, wherein the heating device is located on a surface, opposite of the fluid, of at least one of the plates.

10. The lithographic apparatus of claim 7, wherein the at least one optical element comprises a further channel sharing one of the plates of the channel.

11. The lithographic apparatus of claim 10, wherein the heating device is located on a surface of the shared plate.

12. The lithographic apparatus of claim 1, wherein the optical elements are comprised in a single structure.

13. The lithographic apparatus of claim 1, wherein each heating device comprises an elongated conductor.

14. The lithographic apparatus of claim 13, wherein the elongated conductor comprises one of the group of Cr, Cu, Au and Al.

15. The lithographic apparatus of claim 13, wherein the cross-section of the elongated conductor conforms to a trapezium-shape.

16. The lithographic apparatus of claim 5, wherein the fluid comprises a gas.

17. The lithographic apparatus of claim 16, wherein the gas substantially comprises nitrogen.

18. The lithographic apparatus of claim 5, wherein the fluid comprises a liquid.

19. A device manufacturing method comprising:
imparting a radiation beam with a pattern in its cross-section to form a patterned radiation beam;
projecting the patterned radiation beam onto a target portion of a substrate using a projection system;
locally changing an optical path length of the radiation beam using an array of optical elements arranged transverse to the radiation beam, each optical element comprising an individually addressable electrical heating device; and
controlling the heating devices depending on a phase map in a pupil plane of the projection system.

20. The device manufacturing method of claim 19, further comprising deriving the phase map from an intensity distribution of the radiation beam.

21. The device manufacturing method of claim 19, further comprising controlling the heating devices depending on a history of previously applied intensity distributions, or a history of applied actuation of the heating devices, or both histories.

22. The device manufacturing method of claim 19, further comprising transporting a fluid through a channel in at least one optical element of the array of optical elements to establish a static temperature distribution across the at least one optical element.

23. The device manufacturing method of claim 22, further comprising controlling the heating devices depending on a transport velocity and temperature of the fluid.

* * * * *